(12) United States Patent
Chow

(10) Patent No.: US 9,442,148 B2
(45) Date of Patent: Sep. 13, 2016

(54) ATE TO DETECT SIGNAL CHARACTERISTICS OF A DUT

(75) Inventor: Ka Ho Colin Chow, Brighton, MA (US)

(73) Assignee: Teradyne, Inc., North Reading, MA (US)

( * ) Notice: Subject to any disclaimer, the term of this patent is extended or adjusted under 35 U.S.C. 154(b) by 537 days.

(21) Appl. No.: 13/183,672

(22) Filed: Jul. 15, 2011

(65) Prior Publication Data

US 2013/0018613 A1    Jan. 17, 2013

(51) Int. Cl.
*G01R 31/14*      (2006.01)
*G01R 29/26*      (2006.01)

(52) U.S. Cl.
CPC .................................. *G01R 29/26* (2013.01)

(58) Field of Classification Search
CPC ....................................................... G01R 29/26
USPC .......................................... 702/69, 117, 119
See application file for complete search history.

(56) References Cited

U.S. PATENT DOCUMENTS

| | | | | |
|---|---|---|---|---|
| 4,965,761 | A * | 10/1990 | Schlunt | G06F 17/141 709/405 |
| 5,412,325 | A | 5/1995 | Meyers | |
| 6,268,735 | B1 * | 7/2001 | Craig et al. | 324/603 |
| 6,784,819 | B2 | 8/2004 | Chow | |
| 7,343,558 | B2 | 3/2008 | Kadota | |
| 7,719,451 | B2 | 5/2010 | Tamba | |
| 8,255,183 | B1 * | 8/2012 | Husted | H04B 17/0085 702/117 |
| 2004/0001017 | A1 | 1/2004 | Chow | |
| 2004/0100244 | A1 | 5/2004 | Kurosawa | |
| 2005/0137814 | A1 * | 6/2005 | Kelly et al. | 702/69 |
| 2005/0238094 | A1 | 10/2005 | Bessho et al. | |
| 2007/0225927 | A1 | 9/2007 | Bessho et al. | |
| 2008/0036865 | A1 | 2/2008 | Liu | |
| 2008/0219386 | A1 * | 9/2008 | Chrabieh | H04L 27/3863 375/343 |
| 2009/0068956 | A1 * | 3/2009 | Naito | H04B 17/336 455/67.11 |

(Continued)

FOREIGN PATENT DOCUMENTS

EP      1 260 822       11/2002
JP      4060470 A       2/1992

(Continued)

OTHER PUBLICATIONS

M. Sampietro, L. Fasoli, and G Ferrari, "Spectrum analyzer with noise reduction by cross-correlation technique on two channels", vol. 70, No. 5, May 1999.*

(Continued)

*Primary Examiner* — Lam Nguyen
(74) *Attorney, Agent, or Firm* — Choate, Hall & Stewart LLP

(57) ABSTRACT

Automatic test equipment (ATE) includes: a circuit to split a stimulus signal, which contains both deterministic and random (noise floor) spectra contents, from a device under test (DUT) into a first signal and a second signal; a first channel to receive the first signal, where the first channel adds a first noise floor to the first signal to produce a first channel signal; a second channel to receive the second signal, where the second channel adds a second noise floor to the second signal to produce a second channel signal, the first noise floor, the second noise floor and the DUT noise floor all being mutually uncorrelated; and processing logic to: estimate a first power of the deterministic stimulus signal, and estimate a second total power based on the first channel signal and the second channel signal.

38 Claims, 10 Drawing Sheets

(56) References Cited

U.S. PATENT DOCUMENTS

| | | | | |
|---|---|---|---|---|
| 2009/0082981 | A1* | 3/2009 | Muto | G01R 19/2506 702/77 |
| 2010/0283902 | A1* | 11/2010 | Rashid | H04L 25/022 348/725 |
| 2010/0327860 | A1* | 12/2010 | Daly et al. | 324/240 |

FOREIGN PATENT DOCUMENTS

| | | |
|---|---|---|
| JP | H07-270464 A | 10/1995 |
| JP | 10-082812 A | 3/1998 |
| JP | 2005-184407 A | 7/2005 |
| JP | 2005-308511 A | 11/2005 |
| JP | 2007-295257 A | 11/2007 |
| JP | 04-050783 B1 | 2/2008 |
| JP | 2008-122079 A | 5/2008 |
| JP | 4176479 B2 | 11/2008 |
| TW | 201008141 A | 2/2010 |

OTHER PUBLICATIONS

Authorized officer, Keun Yong Park, International Search Report and Written Opinion mailed Jan. 10, 2013 in international application No. PCT/US2012/046019, 9 pgs.

Alink et al., "A 50MHz-to-1.5GHz Cross-Correlation CMOS Spectrum Analyzer for Cognitive Radio with 89dB SFDR in 1MHz RBW," IEEE (2010), 6 pgs.

Sampietro et al., "Spectrum analyzer with noise reduction by cross-correlation technique on two channels," Rev. Sci. Instrum., 70(5): 2520-2525 (1999).

Office action mailed May 11, 2015 in corresponding Chinese application No. 201280035191.4, 5 pgs.

International Preliminary Report on Patentability mailed in international application No. PCT/US2012/046019, 7 pgs.

Japanese Office Action for JP2014-520242, 5 pages and English Translation, 4 pages (Mar. 29, 2016).

Taiwan Office Action for TW101125248, 3 pages and English Translation, 5 pages (Mar. 10, 2016).

* cited by examiner

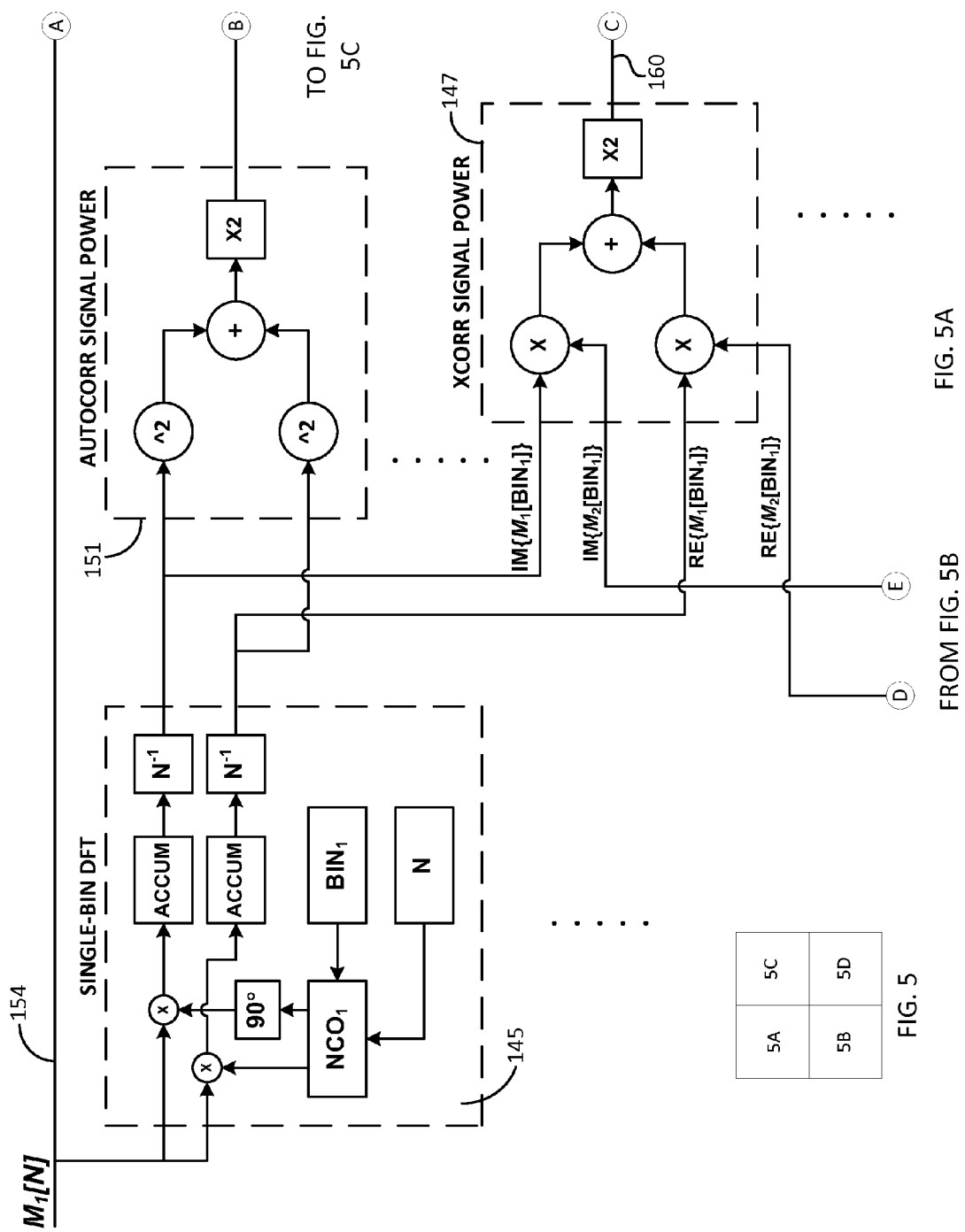

ATE TO DETECT SIGNAL CHARACTERISTICS OF A DUT

TECHNICAL FIELD

This patent application relates generally to automatic test equipment (ATE) configured to detect signal characteristics of a device under test (DUT).

BACKGROUND

ATEs test signal characteristics of DUTs. For example, an ATE may determine a signal-to-noise (SNR) ratio of a DUT. Problems arise, however, if the noise floor of the ATE is above the noise performance level of the DUT. What this means is that the ATE is noisier than the DUT. The ATE's noise therefore interferes with measurement of the DUT's noise. As a result, the ATE cannot accurately measure noise characteristics of the DUT.

SUMMARY

This patent application describes methods and apparatus for detecting signal characteristics of a DUT, such as the DUT's SNR ratio.

Among other things, this patent application describes automatic test equipment (ATE) that comprises: a device under test (DUT) to source an output signal that contains both deterministic and random (noise floor) spectral contents; a circuit to split the stimulus signal from the DUT into a first signal and a second signal; a first ATE channel to receive the first signal, where the first ATE channel adds a first noise floor to the first signal to produce a first channel signal; a second ATE channel to receive the second signal, where the second ATE channel adds a second noise floor to the second signal to produce a second channel signal; and processing logic to: estimate a first power of the deterministic spectral components in the signal from the DUT, and estimate a second total power based on the first channel signal and the second channel signal. The ATE may include any one or more features described in this application, examples of which are as follows.

The processing logic may comprise circuitry for estimating the second total power based on cross-correlation of the first channel signal and the second channel signal. The circuitry may comprise a single accumulator for accumulating a value from the cross-correlation while samples from the first channel and the second channel are being captured.

The deterministic spectral components in the DUT signal may comprise at least one frequency. The processing logic may comprise circuitry for estimating the first power, and the circuitry may comprise a first single bin discrete Fourier transform (DFT) block corresponding to the first channel for generating a first set of coefficients of the first channel signal and a second single bin discrete Fourier transform (DFT) block corresponding to the second channel for generating a second set of coefficients of the second channel signal.

At least one of the first and second single bin discrete Fourier transform (DFT) blocks may comprise a first accumulator and a second accumulator, each for accumulating a corresponding set of coefficients while samples from the first channel and the second channel are being captured. The first accumulator may be configured to accumulate a real part of the coefficients and the second accumulator may be configured to accumulate an imaginary part of the coefficients. The at least one frequency may comprise a fundamental frequency and/or a harmonic of a fundamental frequency.

The circuitry may be configured to receive coefficients from the first and second single bin discrete DFT blocks and to combine the coefficients to determine the first power. The first power may be estimated within a fixed number of time instants.

The processing logic may be configured to calculate a noise floor from the first power and the second total power. The calculated noise floor may be lower than the first noise floor and the second noise floor. The processing logic may be configured to calculate a signal-to-noise ratio for the DUT. The processing logic may comprise a field programmable gate array (FPGA). The second total power may comprise an aggregate power of the cross-correlation of the first channel signal and the second channel signal Among other things, this patent application describes a method performed by automatic test equipment (ATE), which comprises: splitting a stimulus signal containing both deterministic and random (noise floor) spectral components from a device under test (DUT) into a first signal and a second signal; receiving the first signal in a first channel of the ATE, where the first channel adds a first noise floor to the first signal to produce a first channel signal; receiving the second signal in a second channel of the ATE, where the second channel adds a second noise floor to the second signal to produce a second channel signal; and using processing logic to: estimate a first power of the deterministic stimulus signal from the DUT; and estimate a second total power based on the first channel signal and the second channel signal. The ATE may include any one or more features described in this application, examples of which are set forth above.

Among other things, this patent application describes ATE that comprises: an ATE reference source channel to generate a stimulus signal containing both deterministic and random (undesirable noise floor) spectral components; a circuit to split the reference source signal into a first signal and a second signal; a first DUT to receive the first signal, where the first DUT has a first noise floor that produces a first channel signal; a second DUT to receive the second signal, where the second DUT has a second noise floor that produces a second channel signal, and processing logic to: estimate a first power of the first DUT channel; estimate a second power of the second DUT channel; estimate the correlated power between the first DUT channel and the second DUT channel using cross-correlation of the first channel signal and the second channel signal; and estimate the first DUT channel noise power and the second DUT channel noise power based on the first power, the second power, and the correlated power. The ATE may include any one or more features described in this application, examples of which are as follows.

The processing logic may comprise circuitry for estimating the first power based on auto-correlation of the first channel signal. The circuitry may comprise a single accumulator for accumulating a value from the auto-correlation while samples from the first channel are being captured.

The processing logic comprises circuitry for estimating the correlated power. The circuitry may comprise a single accumulator for accumulating a value from the cross-correlation between the first channel signal and the second channel signal while samples from the first channel and the second channel are being captured, where the correlated power comprises stimulus signal (deterministic) power and stimulus noise (random) power.

The reference source signal may comprise at least one frequency. The processing logic may comprise circuitry for estimating stimulus signal power. The circuitry may comprise a first single bin discrete Fourier transform (DFT) block corresponding to the first channel for generating a first set of coefficients of the first channel signal and a second single bin discrete Fourier transform (DFT) block corresponding to the second channel for generating a second set of coefficients of the second channel signal.

The processing logic may be configured to perform operations comprising: estimating first stimulus signal power based on cross-correlation of the first set of coefficients and second set of coefficients, and estimating second stimulus signal power based on auto-correlation of the first set of coefficients. The processing logic may be configured to perform operations comprising: estimating the first power using auto-correlations of the first DUT channel signal; estimating the second power using auto-correlations of the second DUT channel signal; estimating the first DUT channel noise power by subtracting the correlated power from the first power; and estimating the second DUT channel noise power by subtracting the correlated power from the second power.

Any two or more of the features described in this patent application, including this summary section, may be combined to form embodiments not specifically described in this patent application.

All or part of the foregoing may be implemented as a computer program product comprised of instructions that are stored on one or more non-transitory machine-readable storage media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DESCRIPTION OF THE DRAWINGS

Like reference numerals indicate like elements.

DETAILED DESCRIPTION

Figure 1:
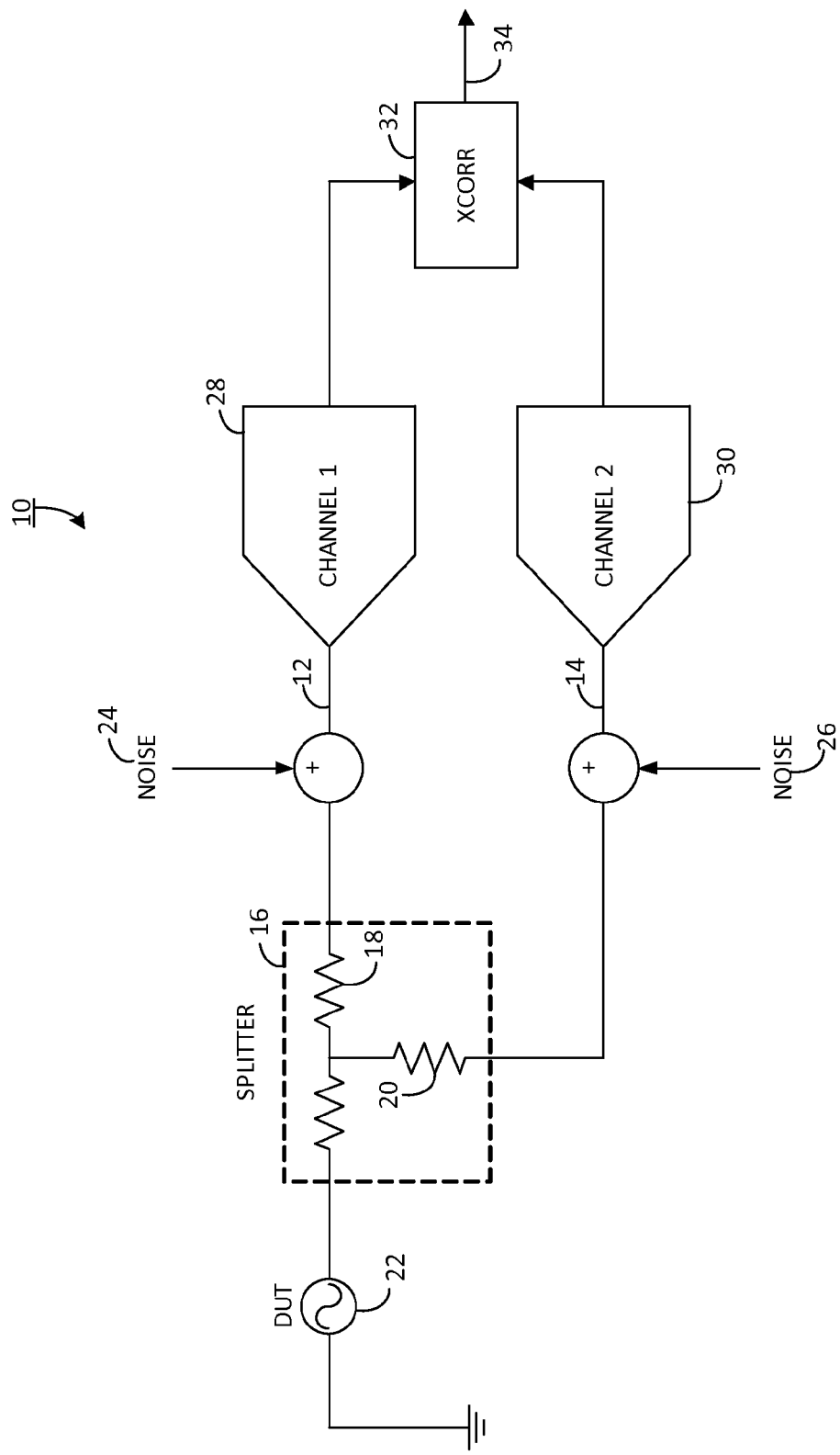
FIG. 1 is a block diagram of channels in ATE, where the DUT is a source device FIG. 2, comprised of FIGS. 2A and 2B, is a block diagram of circuitry included in the channels of the ATE, where the DUT is a source device

Semiconductor manufacturers generally test semiconductor devices at various stages of production. During manufacturing, integrated circuits are fabricated in large quantities on a single silicon wafer. The wafer is cut into individual integrated circuits called dies. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many semiconductor manufacturers test integrated circuits at the wafer level, before a wafer is cut into dies. Defective circuits are marked and generally discarded prior to packaging, thus saving the cost of packaging defective dies. As a final check, many manufacturers test each finished product before it is shipped.

To test quantities of semiconductor components, manufacturers commonly use automatic test equipment ("ATE" or "testers"). In response to instructions in a test program, an ATE automatically generates input signals to be applied to an integrated circuit, and monitors output signals. The ATE compares the output signals with expected responses to determine whether the device under test, or "DUT," is defective.

Customarily, component ATEs are designed in two different portions. A first portion, called a "test head" includes circuitry that may be located close to the DUT, for example, driving circuitry, receiving circuitry, and other circuitry for which short electrical paths are beneficial. A second portion, called a "tester body," is connected to the test head via cables, and contains electronics that may not be close to the DUT.

Special machines move and electrically connect devices to an ATE in succession. A "prober" is used to move devices at the semiconductor wafer level. A "handler" is used to move devices at the packaged device level. Probers, handlers, and other devices for positioning a DUT relative to an ATE are generically known as "peripherals." Peripherals generally include a site where DUTs are positioned for testing. The peripheral feeds a DUT to the test site, the ATE tests the DUT, and the peripheral moves the DUT away from the test site, so that another DUT can be tested.

Among the tests performed by the ATE on the DUT are test of the DUT's signal characteristics, including the amount of noise produced by the DUT. In an implementation, an ATE includes multiple channels—one each for testing a corresponding DUT. Individual channels of the ATE, however, cannot be used to make accurate noise measurements on DUTs that have a noise power level lower than the noise floor of the ATE. It is, however, possible to make noise-related measurements on such DUTs using multiple ATE channels per DUT. For example, instead of connecting a DUT to a single channel of the ATE, the DUT may be connected to multiple channels. Signals from that single DUT may be cross-correlated, as described below, to remove at least some ATE channel noise, thereby enabling measurement of DUT noise that is below the noise floor of the ATE.

To make DUT noise measurements below the noise floor of the ATE, the ATE is configured with a circuit to split the signal coming from a DUT into a first signal and a second signal. A first channel receives the first signal, and adds first noise to the first signal to produce a first channel signal. A second channel receives the second signal, and adds second noise to the second signal to produce a second channel signal. The first noise and the second noise may be ATE channel noise, both of which may be above the noise floor of the DUT. They are also uncorrelated with each other, and each of them is uncorrelated with the DUT noise. Processing logic in the ATE is programmed to correlate a version of the first channel signal and a version of the second channel signal and thereby exclude at least some of the ATE noise in calculating noise power coming from the DUT. The processing logic operates at a speed that enables correlation to be performed in about real-time (e.g., while samples from the first channel and the second channel are being captured).

FIG. 1 shows an example ATE 10 configured to measure DUT noise that is below the ATE's noise floor. In particular, FIG. 1 shows two channels of the ATE: first channel 12 and second channel 14. Although only two channels are shown in FIG. 1, ATE 10 may include other channels. Pairs of these other channels may be configured as shown in FIG. 1. Alternatively, individual channels may be connected to individual DUTs, e.g., to test DUTs have performance levels not below the noise floor of ATE 10.

In FIG. 1, channels 12 and 14 include a splitter circuit 16. Splitter circuit 16, in this example, is a resistive divider circuit, although other power splitting circuit configurations may be used. In this example, the resistive divider circuit includes resistors 18 and 20, which are about equal in resistance. As a result, a signal from DUT 22 will be split about evenly between channel 12 and channel 14. Each ATE measurement channel therefore receives essentially a copy of the same signal. Each ATE channel also adds noise 24, 26 (noise floor) to its corresponding signal from DUT 22. This noise is not added intentionally, but rather is an inherent property of the channel. Channels 12 and 14 are configured (e.g., manufactured) so that about the same overall noise is added to each channel. The noise in/from each channel is not correlated with the noise in/from any other channel. Noise in each channel is also uncorrelated with noise coming from the DUT. As explained below, measurements from both ATE channels may be cross-correlated to remove at least some of that channel noise and thereby enable detection of noise performance of a DUT having a noise floor level below the noise floor of either channel.

Each ATE measurement channel 12, 14 includes channel circuitry 28, 30, such as an analog-to-digital converter (not shown) to digitize the corresponding channel signal (which includes channel noise). The resulting digitized signals are measured by corresponding measurement circuits in the channel circuitry, and output to cross-correlation (Xcorr) circuitry 32. In this example, cross-correlation circuitry 32 is implemented using programmable logic, such as a field programmable gate array (FPGA). Alternatively, cross-correlation circuitry 32 may be implemented using dedicated application-specific integrated circuitry (ASIC), one or more digital signal processors (DSP), or any combination processing logic elements.

Figure 6:
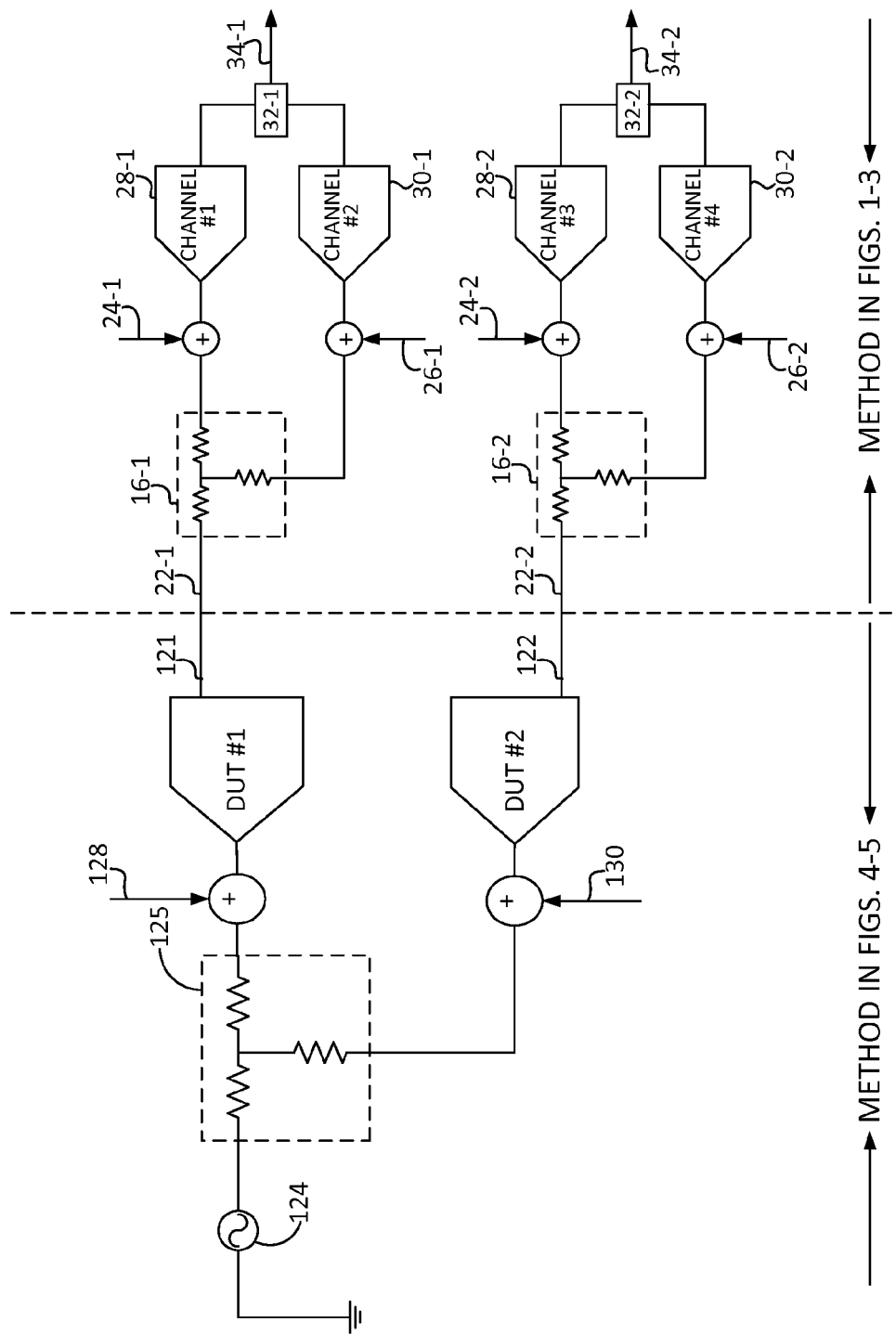
FIG. 6 is a block diagram showing circuitry that combines features of the circuitry of FIGS. 1 and 4.

Cross-correlation circuitry 32 attenuates the uncorrelated noise added in each of the measurement channels, producing more accurate SNR measurements of the DUT. The circuitry outputs one or more signals 34, from which SNR measurements of DUT 22 may be obtained. In an example, cross-correlation circuitry 32 outputs both a DUT noise power and a DUT signal power, as described below, from which the DUT SNR may be calculated. Generally, cross-correlation circuitry 32 performs the following cross-correlation ("x") function on the noise signals, (N(t)), for two channels, "channel 1" 12 and "channel 2" 14. In FIG. 6, cross-correlation circuitry 32 for channels #1 and #2 is labeled 32-1 and the output is labeled 34-1. In FIG. 6, cross-correlation circuitry 32 for channels #3 and #4 is labeled 32-2 and the output is labeled 34-2.

$S_{DUT}(t)$: DUT signal to be measured
$N_1(t)$: noise on measurement channel 1
$N_2(t)$: noise on measurement channel 2
$M_1(t)$: measurement taken by channel 1
$M_2(t)$: measurement taken by channel 2
x: the correlation operator $$M_1(t) = S_{DUT}(t) + N_1(t)$$

$$M_2(t) = S_{DUT}(t) + N_2(t)$$

$$M_1(t) \times M_2(t) = S_{DUT}(t) \times S_{DUT}(t) + S_{DUT}(t) \times N_1(t) + S_{DUT}(t) \times N_2(t) + N_1(t) \times N_2(t)$$

From the uncorrelated noise source assumption, expected values (means) of all cross-correlation terms ($S_{DUT} \times N_1$, $S_{DUT} \times N_2$ and $N_1 \times N_2$) are zero, leaving only $S_{DUT} \times S_{DUT}$ in the above equation The FFT (fast Fourier transform) of $S_{DUT} \times S_{DUT}$ will equal the power spectral density (PSD) of the DUT's signal. Averaging converges at a rate of $1/\sqrt{\#\_average}$. In a decibel (dB) scale, for every 10 times increase in the number of averages, there will be 5 dB ($10 \log \sqrt{10} = 5$) of reduction in uncorrelated noise floor.

Prior art implementation of cross-correlation calls for a combination of the FFT's (Fast Fourier Transform) of sample streams coming from both measurement channels. The following equations describe the cross-correlation function and power-spectral density function:

Cross-correlation (Xcorr) function between $m_1[n]$ and $m_2[n]$ is defined as $$R_{m_1,m_2}[n] = \frac{1}{N} \sum_{i=0}^{N-1} m_1[i+n] \cdot m_2[i]$$

$$= \frac{1}{N} \sum_{j=0}^{N-1} m_1[n - (j - (N-1))] \cdot m_2[(N-1) - j]$$

(Assume $j = N - 1 - i$)

$$= \frac{1}{N} m_1[n - (N-1)] \otimes m_2[(N-1) - n]$$

Power Spectral density (PSD) function is defined as $$S_{m_1,m_2}[\omega] = FFT\{R_{m_1,m_2}[n]\}$$

$$= \frac{1}{N} FFT\{m_1[n - (N-1)]\} \cdot FFT\{m_2[(N-1) - n]\}$$

$$= \frac{1}{N} \left( e^{-\frac{j2\pi\omega(N-1)}{N}} \cdot M_1[\omega] \right) \cdot \left( e^{\frac{j2\pi\omega(N-1)}{N}} \cdot M_2[\omega] \right)^*$$

$$\begin{pmatrix} \text{where } M_1[\omega] = FFT\{m_1[n]\} \text{ and } M_2[\omega] = FFT\{m_2[n]\} \\ FFT\{m_1[n - (N-1)]\} = e^{-\frac{j2\pi\omega(N-1)}{N}} M_1[\omega] \\ M_2^*[\omega] = FFT\{m_2[-n]\} \end{pmatrix}$$

$$= \frac{1}{N} M_1[\omega] \cdot M_2^*[\omega]$$

From the above equations, the power spectral density of the DUT can be calculated as the product of the FFT from one channel and the complex conjugate of the FFT from the other channel. However, such an approach requires calculating the FFT of potentially large sample sets (further multiplied by the number of averages involved), and most likely needs to be off-loaded to DSP processor(s). The data transfer and computation overhead involved may significantly degraded test throughput, which in turn may impact the Cost of Test (COT) metric of an ATE system.

A more throughput-friendly approach for utilizing cross-correlation in the ATE environment is to compute total spectral power (instead of full spectral density function at all frequencies) coming from the DUT. In this implementation, full FFT spectra of both captured sample streams need not be computed. This enables the circuitry described herein to determine the cross-correlation (XCorr) and signal-to-noise ratio (SNR) in real-time, with little or no post-processing overhead.

The total spectral power ($P_{total}$) for the signal from the DUT may be represented as:

$$P_{total} = \sum_{\omega} S_{m_1,m_2}[\omega]$$
$$= R_{m_1,m_2}[0]$$
$$= E(m_1[n] \cdot m_2[n])$$

where E(*) is the expected value function (mean).

For a capture with X samples, $R_{m_1,m_2}[0]$ can be estimated for X times and the resulting average may be represented as:

$$\overline{P}_{total} = \overline{R}_{m_1,m_2}[0]$$
$$= \frac{1}{X}\sum_{i=0}^{X-1} m_1[i] \cdot m_2[i]$$

Figure 2A:
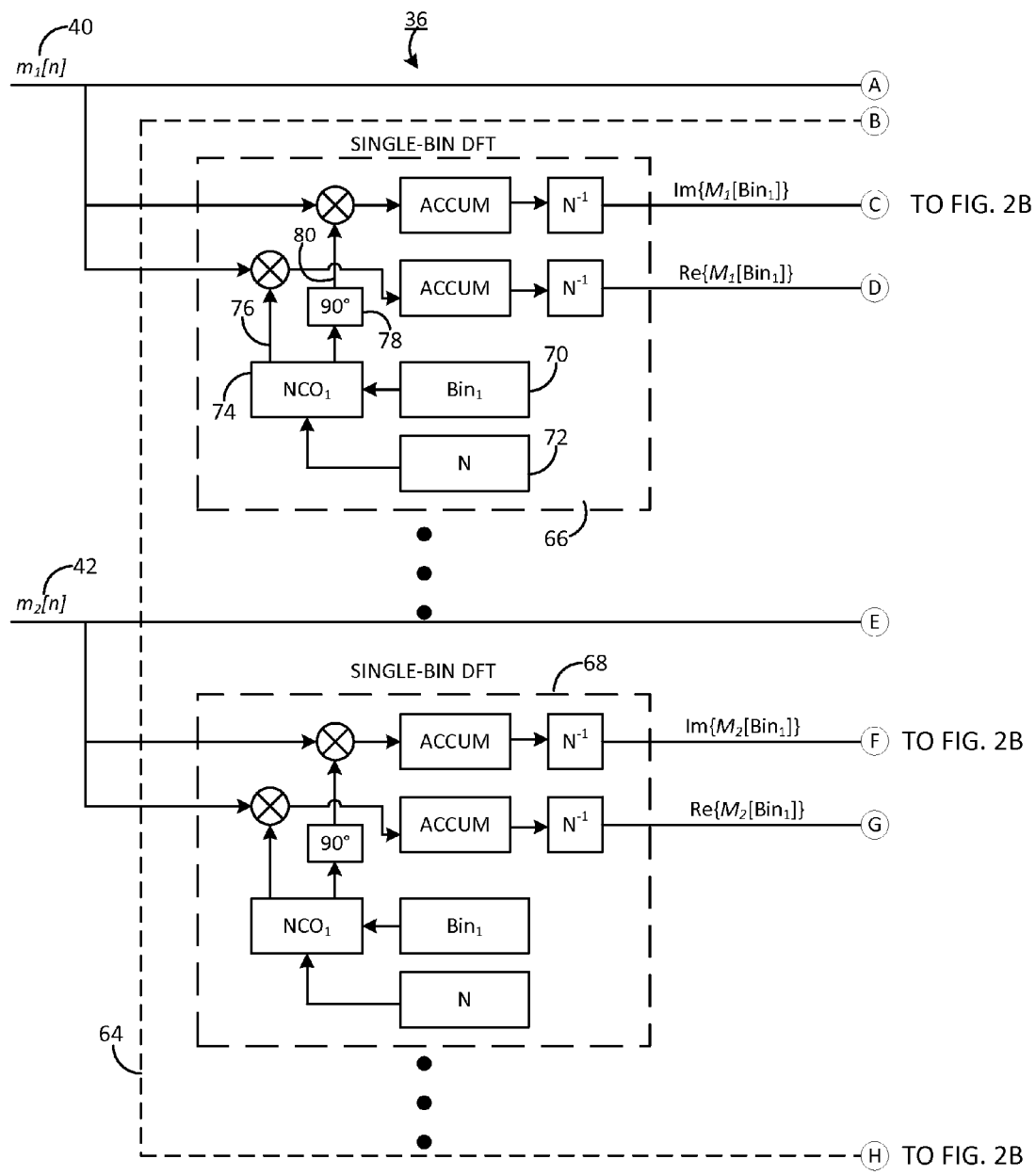
Figure 2B:
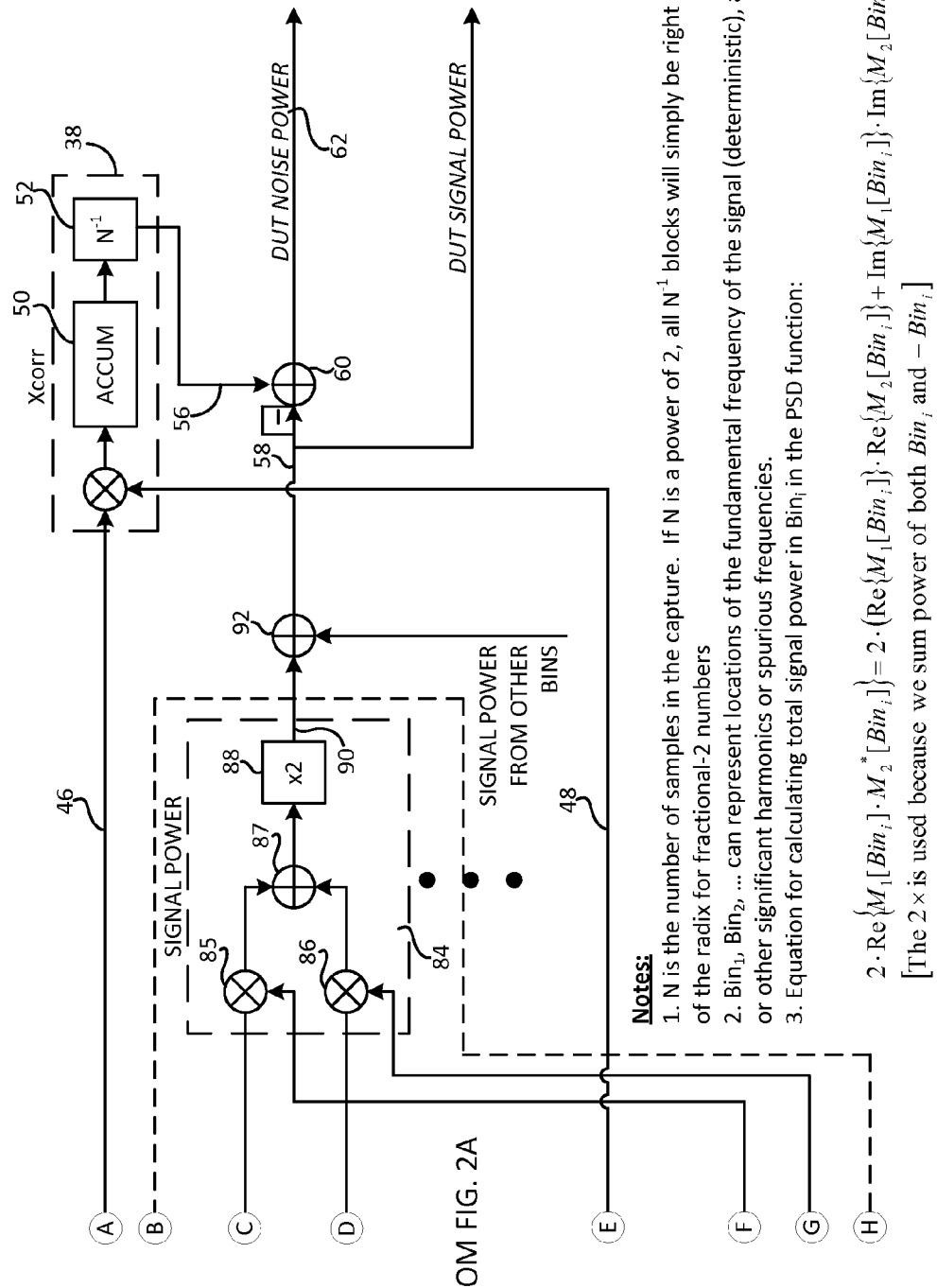

Referring to FIG. 2, channel circuitry 36 includes a cross-correlation circuit (Xcorr block 38) to estimate the total power of a signal coming from a DUT, such as DUT 22 of FIG. 1 (not shown in FIG. 2). Xcorr block 38 does this by multiplying captured samples m[n] 40 and 42 from corresponding channels 46 and 48 (which may be the same as channels 12 and 14 of FIG. 1). The resulting product is summed in accumulator 50. Accumulator 50 is a single accumulator in this example, but may include multiple circuits in other examples. In this example, the combination process takes place in real-time. For example, as each new product is determined, that product is added to the accumulator's sum. Furthermore, this process occurs while samples from the first channel and the second channel are being captured. Thus, there is no need to store each product in memory for later processing. If the number of samples in a capture, N, is a power of two, the $N^{-1}$ block 52 acts to right-shift the radix for fractional-two numbers. Again, this may be done in real-time, without requiring storage of operands in memory prior to processing. To determine the average spectral power density, one may divide total the noise power by the noise-equivalent bandwidth ($BW_{neq}$) of the measurement, which his usually a little higher than the three-dB bandwidth of each measurement channel.

In cases where deterministic signals (carrier signal, spurious signals, etc.) are present, as is the case in this example, their power is determined separately and subtracted from the total power from the DUT in order to estimate a residual noise power (the DUT noise power). SNR can be calculated after DUT signal power and noise power are known.

Accordingly, referring back to FIG. 2, the output 56 of Xcorr block 38 constitutes the total power from the DUT. This total power is a combination of the power of the deterministic signal coming from the DUT (the DUT signal power), and the power of the random noise coming from the DUT (the DUT noise power). To estimate the DUT noise power, and thus the DUT noise floor, the channel circuitry may remove the DUT signal power 58 from the total signal power 56. The result is the DUT noise power 62. In the circuitry of FIG. 2, this is done using logic 60 that subtracts the DUT signal power 58 from the total signal power 56. The resulting difference 62 is the DUT noise power. The DUT noise power and the DUT signal power may be used to estimate the signal-to-noise ratio (SNR) of the DUT, i.e., by determining a ratio between DUT signal power and DUT noise power.

The total power coming from the DUT is estimated by Xcorr block 38, as described above. Circuitry 64 is used to estimate the DUT signal power 58. In this example, circuitry 64 includes a single-bin DFT (discrete Fourier transform) block per channel. Each DFT block 66, 68 estimates signal power at the user-specified bin location in the spectrum of the corresponding measurement channel. The bin location may correspond to the fundamental frequency of the deterministic signal. Additional single-bin DFT blocks (not shown) per channel may be incorporated into circuitry 64 to estimate signal power coming from harmonics of the deterministic signal, or any other deterministic spurious signals. These additional single-bin DFT blocks per channel may have structures and functions similar to DFT blocks 66 and 68.

The power of each channel's deterministic signal can be estimated by a single-bin DFT block. Multiple (a small number compared to a total sample size) blocks may be needed per channel if the deterministic signal of each channel has spectral content at multiple frequencies. The following equations model an example of a single-bin DFT block, such as block 66, which may be implemented, e.g., in a field-programmable gate array (FPGA):

$$\forall \omega \in [0, N-1] \; (\omega \text{ is an integer})$$
$$\text{Re}\{M[\omega]\} = \frac{1}{N}\sum_{i=0}^{N-1} m[i] \cdot \cos\frac{2\pi\omega i}{N}$$
$$\text{Im}\{M[\omega]\} = \frac{1}{N}\sum_{i=0}^{N-1} m[i] \cdot \sin\frac{2\pi\omega i}{N}$$

where m[i] are the captured time-domain samples, and M[ω] is the single-bin DFT at bin ω. "Re" and "Im" represent the real and imaginary parts of the complex DFT value.

DFT blocks 66 and 68 are identical in this example. Therefore, only DFT block 66 is described here. DFT block 66 includes $Bin_1$ 70. The "1" subscript represents the fundamental frequency. For other harmonics or spurs, a subscript "2", "3", etc. may be used. Here, $Bin_1$ contains data representing a location of the fundamental frequency of the corresponding deterministic channel signal. This information may be known/determined beforehand, and programmed into the ATE, e.g., by a user. "N" 72, as indicated above, may be a register representing a number of samples in a data capture from the DUT. The $NCO_1$ (Numerically Controlled Oscillator) block 74 uses the bin location and number of sample's information to produce a digital sinusoidal data stream 76 (the "cos" stream indicated in the above equations) which will be multiplied with channel signal 40 to calculate the real part of the complex DFT value at the specified bin location. This same sinusoidal data 78 is phase-shifted by 90° to produce data 80 (the "sin" stream indicated in the above equations) which will be multiplied with channel signal 40 to calculate the imaginary part of the complex DFT value at the specified bin location. This real and imaginary data are calculated, in real-time, by the corresponding accumulators and scaled by the corresponding $N^{-1}$ blocks. The accumulators and $N^{-1}$ blocks may act on data as the data arrives, and do not require that operands be stored for later processing.

The real ($Re\{M_1[Bin_1]\}$, $Re\{M_2[Bin_1]\}$) and imaginary ($Im\{M_1[Bin_1]\}$, $Im\{M_2[Bin_1]\}$) parts of each channel signal are output by corresponding DFT blocks 66, 68. The real and imaginary parts are output to signal power block 84, as shown. Signal power block 84 contains logic to combine the real and imaginary parts from the DFT blocks to produce a signal power output for the fundamental frequency. This logic may combine (e.g., sum) this signal power output from other bins (not shown) corresponding to other harmonics or spurs, if any. The resulting signal power output 58 is provided to logic 60 where it may be subtracted from the total power to produce the DUT noise power, as described above.

In this implementation, signal power block 84 includes multiplication block 85 for multiplying the real parts of the channel signals, and multiplication block 86 for multiplying the imaginary parts of the channel signals. The resulting products are added via summation block 87, and multiplied by two in X2 block 88, according to the following equation:

$$2 \cdot (Re\{M_1[Bin_i]\} \cdot Re\{M_2[Bin_i]\} + Im\{M_1[Bin_i]\} \cdot Im\{M_2[Bin_i]\})$$

The "2" is used here because power is summed for both $Bin_i$ and $-Bin_i$.

The resulting signal 90 corresponds to the signal power for the fundamental frequency of the channel signal. This signal 90 may be combined with signal power from other harmonics or known spurious signals (not included in this example) in summation block 92 to produce the DUT signal power 58.

Generally, as more samples are processed, more accurate estimations of total power and DUT signal power result. It is possible to determine the number samples (X) from a channel required to meet a predefined uncertainty criterion based on relative noise magnitudes between the DUT and measurement channel. As an example, assume $P_{DUT}/P_{m\_noise}=0.1$, i.e., DUT noise power ($P_{DUT}$) is 10 dB lower than measurement channel noise floor ($P_{m\_noise}$). In this example, the uncertainty requirement is <0.5 dB with k=3, i.e., standard deviation of the measurement multiplied by 3 must be less than 0.5 dB. Accordingly:

$$\text{Stdev} < (P_{DUT} \times [10^{0.5/10}-1])/3 = 0.0407 \times P_{DUT}$$

A minimum number of samples, X, to meet the foregoing criteria can be estimated as follows:

$$STD(\tilde{P}_{DUT}) = \sqrt{\frac{(P_{DUT}+P_{m\_noise})^2 + P_{DUT}^2}{X}}$$

$$0.0407 P_{DUT} = \sqrt{\frac{(P_{DUT}+10P_{DUT})^2 + P_{DUT}^2}{X}}$$

$$X = \frac{(P_{DUT}+10P_{DUT})^2 + P_{DUT}^2}{(0.0407)^2 P_{DUT}^2} \approx 73748$$

where "STD" refers to the standard deviation.

The following equations provide mean and variance analyses of the total DUT power estimation function, $P_{DUT}$, with the following assumptions:
Total # Samples=X $$\forall i,j \in [0, X-1]$$

$$m_1(i) = s_{DUT}(i) + n_1(i)$$

$$m_2(i) = s_{DUT}(i) + n_2(i)$$

Zero-Mean Noise Distributions:

$$E(s_{DUT}(i)) = E(n_1(i)) = E(n_2(i)) = 0$$

"White" Noise (Uncorrelated for any Time Offset of than 0):

$$E(s_{DUT}(i) \cdot s_{DUT}(j)) = 0$$

$$E(n_1(i) \cdot n_1(j)) = 0$$

$$E(n_2(i) \cdot n_2(j)) = 0 \ \forall i \neq j$$

DUT and Measurement Noise Distributions are Uncorrelated:

$$E(s_{DUT}(i) \cdot n_1(j)) = E(s_{DUT}(i) \cdot n_2(j)) = E(i) \cdot n_2(j)) = 0$$

Noise Power of DUT: $P_{DUT} = E(s_{DUT}^2(i))$
Noise Power Measurement Channel: $P_{m\_Noise} = E(n_1^2(i)) = E(n_2^2(i))$ The mean is determined as follows:

$$\tilde{P}_{DUT} = \frac{1}{X} \sum_{i=0}^{X-1} m_1(i) \cdot m_2(i)$$

$$E(\tilde{P}_{DUT}) = E\left(\frac{1}{X} \sum_{i=0}^{X-1} m_1(i) \cdot m_2(i)\right)$$

$$= \frac{1}{X} \sum_{i=0}^{X-1} E(m_1(i) \cdot m_2(i))$$

$$= \frac{1}{X} \sum_{i=0}^{X-1} E\left(\begin{array}{c} s_{DUT}^2(i) + s_{DUT}(i) \cdot n_1(i) + \\ s_{DUT}(i) \cdot n_2(i) + n_1(i) \cdot n_2(i) \end{array}\right)$$

$$= \frac{1}{X} \sum_{i=0}^{X-1} \left[\begin{array}{c} E(s_{DUT}^2(i)) + E(s_{DUT}(i) \cdot n_1(i)) + \\ E(s_{DUT}(i) \cdot n_2(i)) + E(n_1(i) \cdot n_2(i)) \end{array}\right]$$

$$= \frac{1}{X} \sum_{i=0}^{X-1} [E(s_{DUT}^2(i))]$$

$$= E(s_{DUT}^2(i))$$

$$= P_{DUT}$$

The mean of the estimation function is equal to total DUT power. In other words, the estimation function $\tilde{P}_{DUT}$ is unbiased.

The variance is determined as follows:

$$E(\tilde{P}_{DUT}^2) = E\left(\left(\frac{1}{X}\sum_{i=0}^{X-1} m_1(i) \cdot m_2(i)\right) \cdot \left(\frac{1}{X}\sum_{j=0}^{X-1} m_1(j) \cdot m_2(j)\right)\right)$$

$$= \frac{1}{X^2} \sum_{i=0}^{X-1}\sum_{j=0}^{X-1} E\left(\begin{array}{c}\left(\begin{array}{c}s_{DUT}^2(i)+s_{DUT}(i)\cdot n_1(i)+\\ s_{DUT}(i)\cdot n_2(i)+n_1(i)\cdot n_2(i)\end{array}\right)\cdot\\ \left(\begin{array}{c}s_{DUT}^2(j)+s_{DUT}(j)\cdot n_1(j)+\\ s_{DUT}(j)\cdot n_2(j)+n_1(j)\cdot n_2(j)\end{array}\right)\end{array}\right)$$

$$= \frac{1}{X^2}\left[\begin{array}{c}\sum_{i=0}^{X-1}\left(\begin{array}{c}E(s_{DUT}^4(i))+E(s_{DUT}^2(i)\cdot n_1^2(i))+\\ E(s_{DUT}^2(i)\cdot n_2^2(i))+E(n_1^2(i)\cdot n_2^2(i))\end{array}\right)+\\ \sum_{i=0}^{X-1}\sum_{\substack{j=0\\i\neq j}}^{X-1} E(s_{DUT}^2(i)\cdot s_{DUT}^2(j))\end{array}\right]$$

(∵ all cross-terms with single-power product of $S_{DUT}$, $n_1$ and $n_2$ will be zero because of the uncorrelated properties)

$$= \frac{1}{X^2}\left[\sum_{i=0}^{X-1}\binom{E(s_{DUT}^4(i)) + (P_{DUT} \cdot P_{m\_noise}) +}{(P_{DUT} \cdot P_{m\_noise}) + (P_{m\_noise}^2)} + \sum_{i=0}^{X-1}\sum_{\substack{j=0 \\ i \neq j}}^{X-1}(P_{DUT}^2)\right]$$

$$= \frac{1}{X}(2 \cdot (P_{DUT} \cdot P_{m\_noise}) + P_{m\_noise}^2) + \frac{1}{X}E(s_{DUT}^4(i)) + \left(1 - \frac{1}{X}\right)P_{DUT}^2$$

$$= \frac{1}{X}\begin{pmatrix} 2 \cdot (P_{DUT} \cdot P_{m\_noise}) + P_{m\_noise}^2 + \\ (E(s_{DUT}^4(i)) - E(s_{DUT}^2(i))^2) \end{pmatrix} + P_{DUT}^2 [\because P_{DUT} = E(s_{DUT}^2(i))]$$

$$E(\tilde{P}_{DUT}^2) - P_{DUT}^2 = \frac{1}{X}\begin{pmatrix} 2 \cdot (P_{DUT} \cdot P_{m\_noise}) + \\ P_{m\_noise}^2 + VAR(s_{DUT}^2(i)) \end{pmatrix}$$

$$E(\tilde{P}_{DUT}^2) - E(\tilde{P}_{DUT})^2 = \frac{1}{X}\begin{pmatrix} 2 \cdot (P_{DUT} \cdot P_{m\_noise}) + \\ P_{m\_noise}^2 + VAR(s_{DUT}^2(i)) \end{pmatrix}$$

$$[\because P_{DUT} = E(\tilde{P}_{DUT})]$$

$$VAR(\tilde{P}_{DUT}) = \frac{1}{X}\begin{pmatrix} 2 \cdot (P_{DUT} \cdot P_{m\_noise}) + \\ P_{m\_noise}^2 + VAR(s_{DUT}^2(i)) \end{pmatrix}$$

$$= \frac{1}{X}\begin{pmatrix} 2 \cdot (P_{DUT} \cdot P_{m\_noise}) + \\ P_{m\_noise}^2 + 2 \cdot P_{DUT}^2 \end{pmatrix}$$

$$\begin{bmatrix} \because s_{DUT}^2(i) \sim \chi_1^2 \Rightarrow VAR(s_{DUT}^2(i)) = \\ 2 \cdot VAR(s_{DUT}(i))^2 = 2 \cdot P_{DUT}^2 \end{bmatrix}$$

$$= \frac{1}{X}((P_{DUT} + P_{m\_noise})^2 + P_{DUT}^2)$$

The variance of the estimation function determines the uncertainty of the measurement. This equation was used in the previous example determining the minimum number of samples (X) based on a specific uncertainty requirement.

Figure 3:
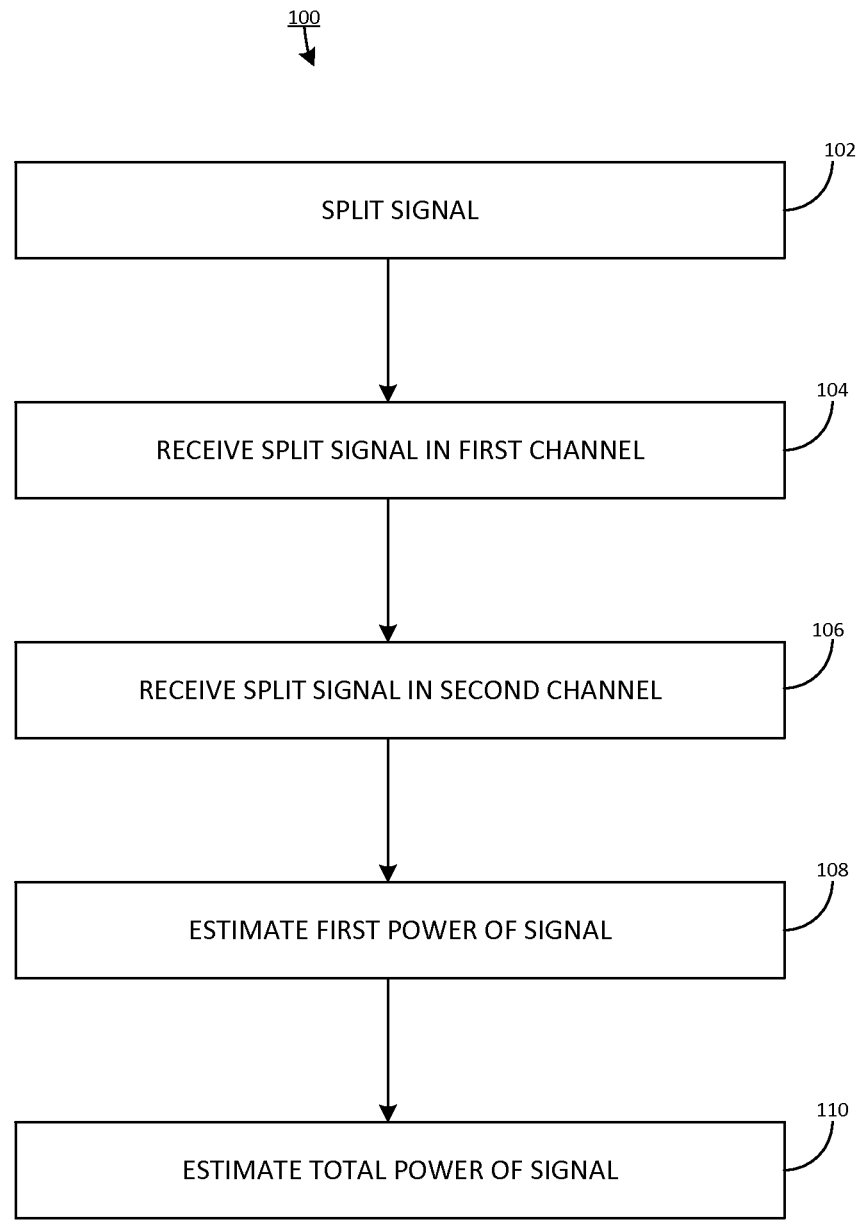
FIG. 3 is a flowchart showing a cross-correlation process performed in the channels of the ATE to reduce noise inherent in those channels, where the DUT is a source device.

FIG. 3 shows an example of a process 100 that may be performed on the circuitry shown in FIGS. 1 and 2. It is noted, however, process 100 may be performed by, or using, other circuitry not described herein. Referring to FIG. 3, a stimulus signal from a device under test (DUT) is split (102) into a first signal and a second signal. The first signal is received (104) in a first channel of the ATE. The first channel adds a first noise floor (e.g. noise 24 of FIG. 1) to the first signal to produce a first channel signal. The second signal is received (106) in a second channel of the ATE. The second channel adds a second noise floor (e.g., noise 26 of FIG. 1) to the second signal to produce a second channel signal. The first noise floor and the second noise floor are uncorrelated, as indicated above. Processing logic is used to estimate (108) a first power of the stimulus signal, and estimate (110) a second total power based on the first channel signal and the second channel signal, as described above. The processing logic may include the circuitry shown in FIGS. 1 and 2, or any appropriate circuitry including, but not limited to, FPGAs, digital signal processor(s), and microprocessor(s).

The configuration of FIGS. 1 and 2 depict the DUT as a source device, e.g., as a source of signals for ATE 10. Circuitry, such as that shown in FIGS. 4 and 5, may be used to perform testing in a case where the DUT acts as a capture device. The circuitry of FIGS. 4 and 5 may be used to extract the uncorrelated power of each DUT channel using a cross-correlation circuit that estimates the total power of a reference signal.

Figure 4:
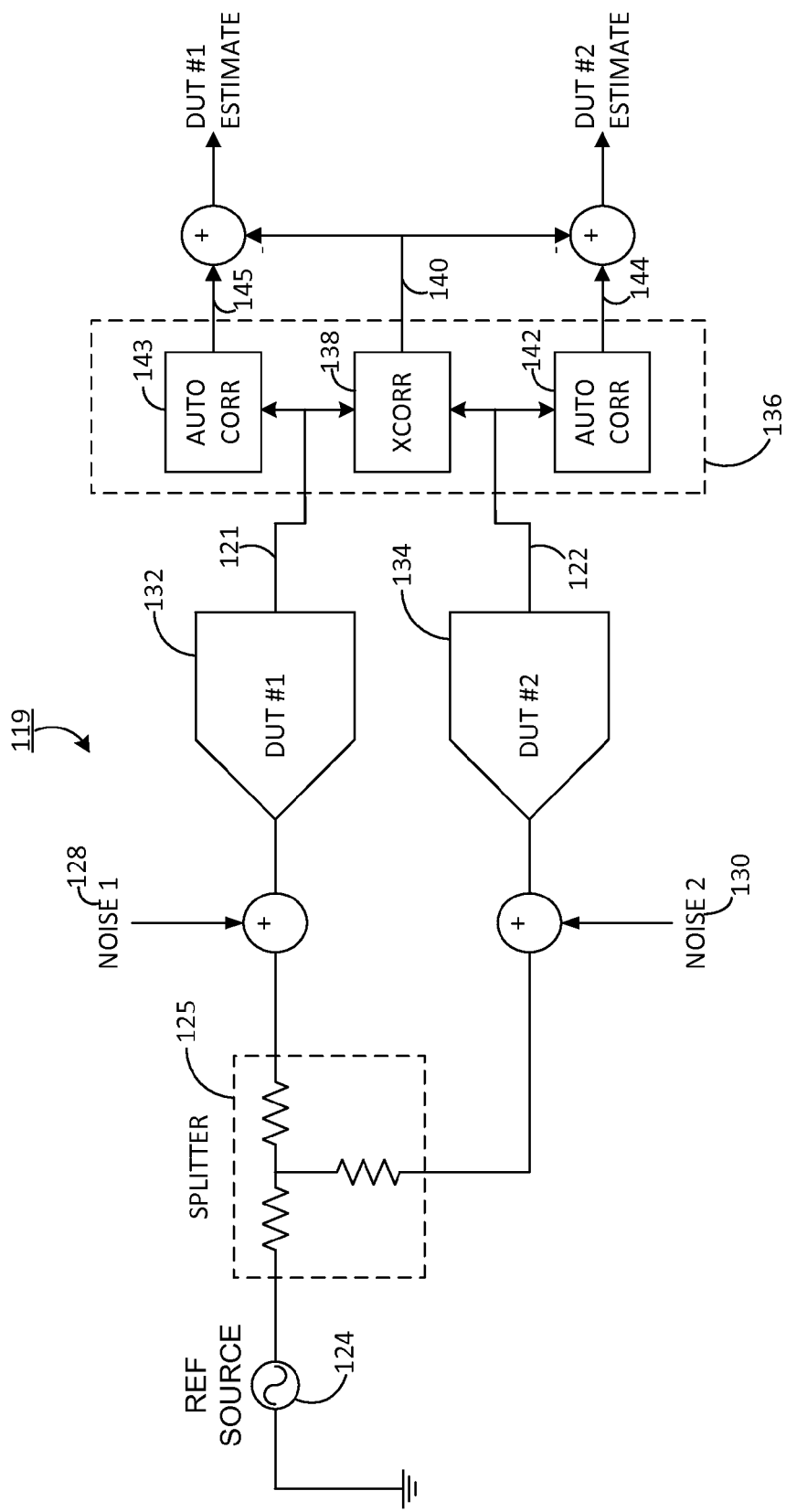
FIG. 4 is a block diagram of channels in ATE, where the DUT is a capture device.

More specifically, FIG. 4 shows an ATE source channel 124, which acts as a reference source providing a stimulus signal. There are two additional measurement channels of the ATE 119: first channel 121 and second channel 122 which receive output signals from DUTs 132 and 134. For simplicity of the analysis, it is assumed that both channels 121 and 122 are "noiseless". The reference source channel (containing reference source 124), on the other hand, is noisy and contributes to an undesirable noise floor. The following paragraphs will describe how to use cross-correlation and auto-correlation to extract DUT noise floor information independent of the noise floor contribution from the reference source 124.

In FIG. 4, reference source 124 provides stimulus signal which passes through a splitter circuit 125 to two DUT's 132 and 134, both of which are configured as capture devices. In an example, both of the DUTs are analog-to-digital converters. Splitter circuit 125, as above in FIG. 2, may be a resistive divider circuit, although other circuit configurations may be used. Each DUT therefore receives essentially a copy of the same signal. Each DUT also adds noise floor 128, 130 to its corresponding input signal from source 124. This noise is not added intentionally, but rather is an inherent property of the DUT that is to be measured. The added noise signals in each DUT are not correlated with each other, and each of them is uncorrelated with the input noise floor from source 124.

The outputs (digital sample streams) coming from both DUT's 132 and 134 are passed to ATE digital receiver channels 121, 122. As long as the digital receiver channels 121 and 122 have zero bit error rate (BER) and do not corrupt the sample streams, both ATE channels can be regarded as "noiseless". The digital sample streams from both channels are sent to the auto-correlation-cross-correlation circuitry 136. In this example, circuitry 136 is implemented using programmable logic, such as a field programmable gate array (FPGA). Alternatively, circuitry 136 may be implemented using dedicated application-specific integrated circuitry (ASIC), one or more digital signal processors (DSP), or any combination processing logic elements.

As above, circuitry 136 includes cross-correlation circuit 138 to correlate noise in first DUT 132 and second DUT 134 to thereby exclude uncorrelated noise contribution from each DUT. The circuitry outputs a signal 140, which corresponds to the noise power (reference source noise power) attributed to the signal provided by reference source 124. As above, circuitry 138 performs cross-correlation ("x") function to eliminate uncorrelated noise power, ($N_1(t)$ and $N_2(t)$ coming from the two DUT's 132 and 134.

Circuitry 136 also includes auto-correlation circuits 142 and 143, each of which performs an auto-correlation function on the digital sample stream from each corresponding DUT to determine total noise power (reference noise power plus DUT noise power) for the corresponding DUT, denoted as 144 and 145. The reference source noise power 140 is subtracted from 144 and 145 for each DUT channel to produce the uncorrelated noise power for each DUT (DUT #1 estimate and DUT #2 estimate in the figure).

Generally, circuitry 136 performs the following functions on the sample streams from 121, 122 to determine the uncorrelated noise floor for each DUT. The variables have similar meanings as in the equations provided above for circuitry 32. $N_1(t)$ and $N_2(t)$ now refer to the noise power coming from the DUT's 132 and 134, and $S_{ref}(t)$ refers to noise power coming from the reference source 124. The goal is to calculate $N_1(t)$ and $N_2(t)$ instead of $S_{ref}(t)$, though $S_{ref}(t)$ still needs to be determined as an intermediate step.

$$M_1 = S_{ref} + N_1$$

$$M_2 = S_{ref} + N_2$$

$$M_1 \times M_2 = S_{ref} \times S_{ref} + S_{ref} \times N_1 + S_{ref} \times N_2 + N_1 \times N_2 \rightarrow S_{ref} \times S_{ref}$$

$$M_1 \times M_1 =$$

$$S_{ref} \times S_{ref} + S_{ref} \times N_1 + S_{ref} \times N_1 + N_1 \times N_1 \rightarrow S_{ref} \times S_{ref} + N_1 \times N_1$$

$$M_2 \times M_2 = S_{ref} \times S_{ref} + S_{ref} \times N_2 + S_{ref} \times N_2 + N_2 \times N_2 \rightarrow$$

$$S_{ref} \times S_{ref} + N_2 \times N_2$$

So to find the DUT noise floor, $$N_1 \times N_1 = M_1 \times M_1 - M_1 \times M_2$$

$$N_2 \times N_2 = M_2 \times M_2 - M_1 \times M_2$$

Averaging converges at a rate of $1/\sqrt{\#\_average}$

Figure 5B:
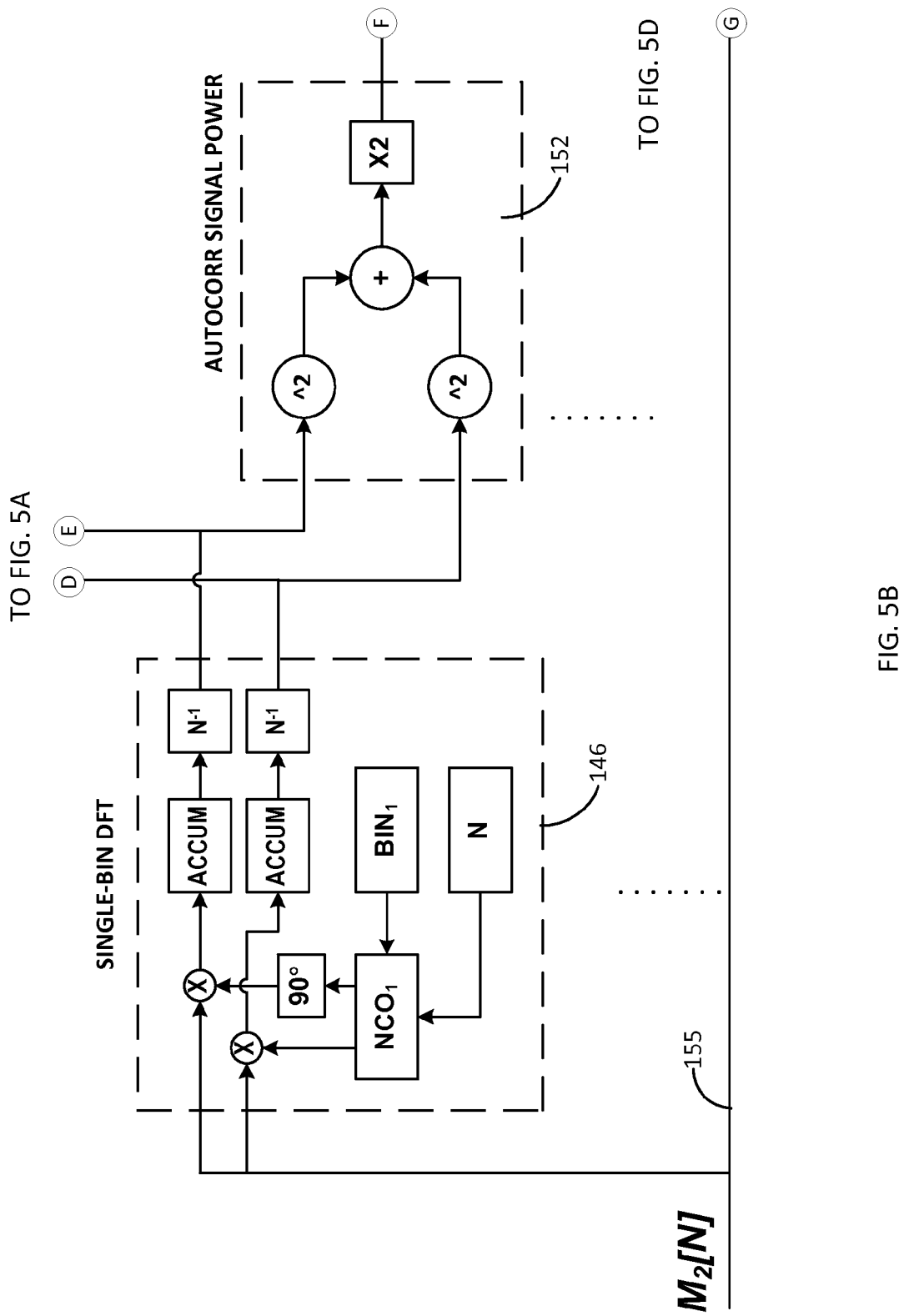
FIG. 5, comprised of FIGS. 5A, 5B, 5C and 5D, is a block diagram of circuitry included in the channels of the ATE, where the DUT is a capture device.
Figure 5C:
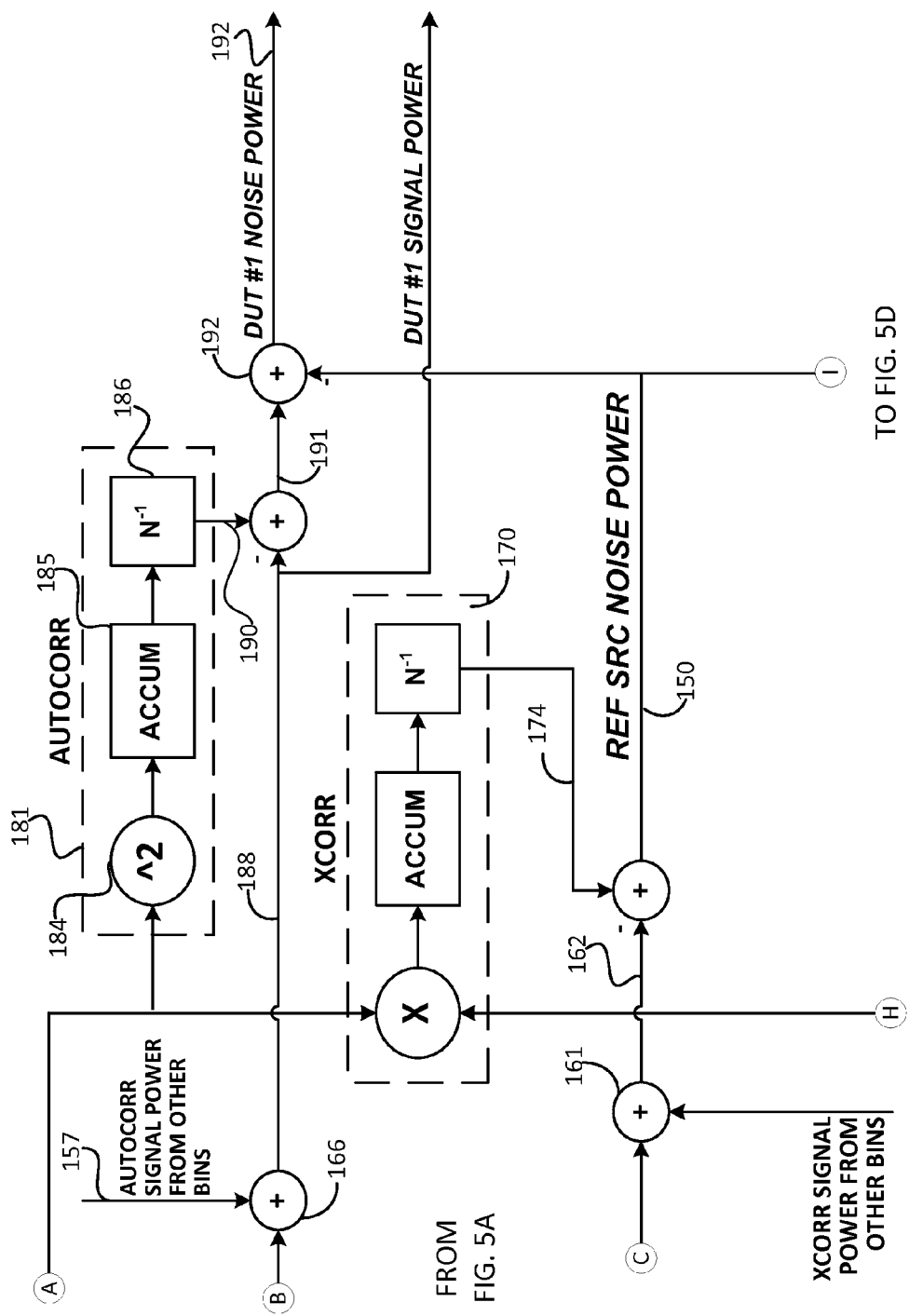
Figure 5D:
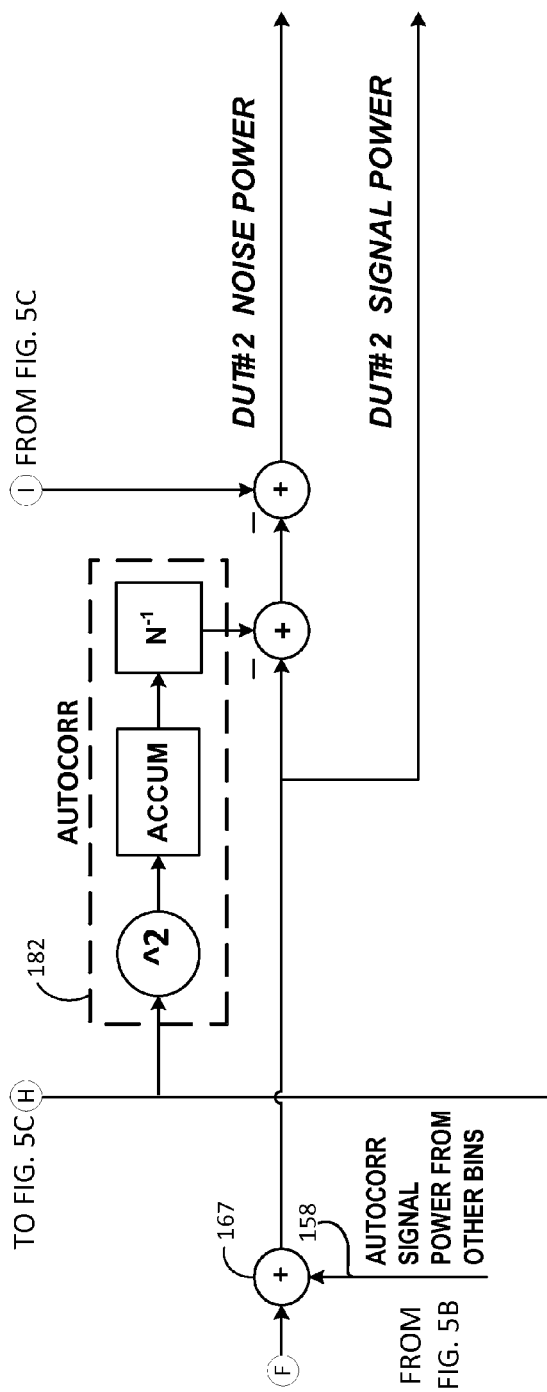

FIG. 5 shows an implementation of the circuitry depicted in block diagram form in FIG. 4. In FIG. 5, blocks 145, 146 and 147 correspond to blocks 66, 68 and 84, respectively, of FIG. 2. Their configuration and function is substantially the same as in FIG. 2. The resulting output, taking into account contribution(s) from other harmonic(s) or spur(s), is the reference source noise power 150, which is the counterpart to the DUT noise power 62 output in FIG. 2. The reference source noise power is the noise power output by a reference noise source (e.g., 124 in FIG. 4). Blocks 151 and 152 are auto-correlation signal power blocks, and are configured to receive the real and imaginary parts of each channel signal, and to perform an auto-correlation to generate a signal power for each respective DUT channel 154 and 155 (which may be the same as DUT channels 121 and 122 of FIG. 4). Auto-correlation signal powers 157, 158 from bins corresponding to non-fundamental frequencies of the channel signals may be incorporated into the signal power, as was the case above.

The first calculation below is performed by block 147 to determine signal 160, which corresponds to the signal power for the fundamental frequency of the reference source signal. Signal 160 may be combined with signal power from other harmonics (not included in this example) in summation block 161 to produce the reference source signal power 162. The second and third calculations below may be performed by auto correlation blocks 151 and 152 to determine the signal power for the fundamental frequency in each DUT channel. This signal power may be combined with signal power from other harmonics (not included in this example) in a summation block (e.g., blocks 166, 167) to produce the DUT channel signal power.

$$2 \cdot Re\{M_1[Bin_i] \cdot M_2^*[Bin_i]\} = 2 \cdot (Re\{M_1[Bin_i]\} \cdot Re\{M_2[Bin_i]\} + Im\{M_1[Bin_i]\} \cdot Im\{M_2[Bin_i]\})$$

$$2 \cdot Re\{M_1[Bin_i] \cdot M_1^*[Bin_i]\} = 2 \cdot (Re\{M_1[Bin_i]\}^2 + Im\{M_1[Bin_i]\}^2)$$

$$2 \cdot Re\{M_2[Bin_i] \cdot M_2^*[Bin_i]\} = 2 \cdot (Re\{M_2[Bin_i]\}^2 + Im\{M_2[Bin_i]\}^2)$$

Xcorr block 170 corresponds to block 38 of FIG. 2, and generates the total power 174 associated with the reference source signal. The reference source signal power 162 is subtracted from the total power in block 174 to produce the reference source noise power 150.

Auto-correlation blocks 181 and 182 generate the total power for each respective DUT channel 154 and 155. Taking block 181 as an example (both blocks 181 and 182 operate the same), incoming samples are squared in block 184, accumulated in real-time in block 185, and right-shifted in block 186. The signal power 188 is subtracted from the total power 190, and the reference source noise power 150 is subtracted from that difference 191 in block 192 to produce uncorrelated noise power for DUT #1. These processes and calculations may be performed for each DUT channel.

Referring to FIGS. 4 and 6, in the case where channels 121 and 122 are "noisy" (e.g., as is the case with analog channels), it is possible to isolate noise floor contributions coming from each DUT and reference source 124 from the noise floor contribution of channels 121 or 122 by using the cross-correlation method described with respect FIGS. 1 to 3. This may be done by adding additional splitters (16-1 and 16-2) and ATE receive channels (28-1, 30-1, 28-2, 30-2) having uncorrelated noise floors, which will essentially eliminate noise floor contributions from the ATE receive channels. A method similar to that described with respect to FIGS. 4 and 5 can then be used to calculate noise floor coming from each DUT.

In the example shown in FIG. 6, both of the DUTs are analog amplifiers. Analog outputs from both DUT's are passed to ATE analog receiving channels 121, 122. In this regard, we note that these outputs are the outputs of the DUTs, not the outputs produced by block 136 of FIG. 4 (which is not depicted in FIG. 6). These channels 121 and 122 add additional channel noise to the DUT outputs. Note that here for consistency with the descriptions relating to FIGS. 1 and 4, channels 121 and 122 pass DUT signals free of ATE receiver channel noise while 22-1 and 22-2 represent additive noise in the ATE receive channels. References 24-1 and 24-2 identify first noise in the different channels; references 26-1 and 26-2 identify second noise in the different channels; references 32-1 and 32-2 identify cross-correlation circuitry in the different channels; and references 24-1 and 24-2 identify signals in the different channels. The method described with respect to FIGS. 1 to 3 may be used to isolate analog receive channel noise contributions and extract DUT output signals on channels 121 and 122. Subsequently after obtaining these DUT output signals, a method similar to that described with respect to FIGS. 4 and 5 can be applied to determine noise contribution from the ATE reference source and extract the DUT noise contributions. The following equations are examples of computations that are performed by the circuitry of FIG. 6:

Measurement from ATE receive channel 28-1:
$$M_{11} = S_{DUT1} + N_s + N_1$$
Measurement from ATE receive channel 30-1:
$$M_{12} = S_{DUT1} + N_s + N_2$$
Measurement from ATE receive channel 28-2:
$$M_{21} = S_{DUT2} + N_s + N_3$$
Measurement from ATE receive channel 30-2:
$$M_{22} = S_{DUT2} + N_s + N_4$$
where $S_{DUT1}$=noise floor from DUT #1 (128)
$S_{DUT2}$=noise floor from DUT #2 (130)
$N_s$=noise floor from reference ATE source (124)
$N_1, N_2, N_3, N_4$=noise floor from ATE receive channels 28-1, 30-1, 28-2 and 30-2 respectively Apply cross-correlation method among the receive channels as described in FIGS. 1-3, $$M_{11} \times M_{12} = S_{DUT1} \times S_{DUT1} + N_s \times N_s + 2 \times N_s \times S_{DUT1} + S_{DUT1} \times N_1 + S_{DUT1} \times N_2 + N_1 \times N_2 + N_s \times N_1 + N_s \times N_2 \rightarrow S_{DUT1} \times S_{DUT1} + N_s \times N_s$$

$$M_{21} \times M_{22} = S_{DUT2} \times S_{DUT2} + N_s \times N_s + 2 \times N_s \times S_{DUT2} + S_{DUT2} \times N_3 + S_{DUT2} \times N_4 + N_3 \times N_4 + N_s \times N_3 + N_s \times N_4 \rightarrow S_{DUT2} \times S_{DUT2} + N_s \times N_s$$

Apply cross-correlation method between the two DUT output streams as described in FIGS. 4-5, $$M_{11} \times M_{22} = S_{DUT1} \times S_{DUT2} + N_s \times N_s + N_s \times S_{DUT1} + N_s \times S_{DUT2} + S_{DUT2} \times N_1 + S_{DUT1} \times N_4 + N_1 \times N_4 + N_s \times N_1 + N_s \times N_4 \rightarrow N_s \times N_s$$

So to find the DUT noise floor, $$S_{DUT1} = M_{11} \times M_{12} - M_{11} \times M_{22}$$

$$S_{DUT2} = M_{21} \times M_{22} - M_{11} \times M_{22}$$

Averaging converges at a rate of $1/\sqrt{\#\_average}$

The control features described herein can be implemented, at least in part, via a computer program product, i.e., a computer program tangibly embodied in one or more information carriers, e.g., in one or more tangible, non-transitory machine-readable storage media, for execution by, or to control the operation of, data processing apparatus, e.g., a programmable processor, a computer, or multiple computers A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the control features can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different embodiments described herein may be combined to form other embodiments not specifically set forth above. Elements may be left out of the structures described herein without adversely affecting their operation. Furthermore, various separate elements may be combined into one or more individual elements to perform the functions described herein.

Elements of different implementations described herein may be combined to form other implementations not specifically set forth above. Other implementations not specifically described herein are also within the scope of the following claims.

What is claimed is:

1. Automatic test equipment (ATE) comprising:
   a circuit to split a deterministic stimulus signal from a device under test (DUT) into a first signal and a second signal, the first signal and the second signal being identical signals;
   a first channel to receive the first signal, the first channel adding a first noise floor to the first signal to produce a first channel signal;
   a second channel to receive the second signal, the second channel adding a second noise floor to the second signal to produce a second channel signal; and
   processing logic to:
     estimate a first power of the deterministic stimulus signal based on a number of samples of the first and second signals, the number of the samples being selected to meet a noise uncertainty criterion that is based on relative noise magnitudes between the DUT and a channel of the deterministic signal, the processing logic comprising first channel circuitry in the first channel and second channel circuitry in the second channel, wherein outputs of the first channel circuitry and the second channel circuitry are used in estimating the first power of the deterministic signal; and
     estimate a second total power from the DUT based on the first channel signal and the second channel signal, wherein the processing logic comprises common channel circuitry for estimating, in real-time, the second total power corresponding to an output of cross-correlation of the first channel signal with the second channel signal, the second total power from the DUT comprising the first power plus a noise power from the DUT; and
     calculate a noise floor from the first power and the second total power resulting in a calculated noise floor.

2. The ATE of claim 1, wherein the common channel circuitry comprises a single accumulator for accumulating a value from the cross-correlation while samples from the first channel and the second channel are being captured.

3. The ATE of claim 2, wherein the deterministic stimulus signal comprises at least one frequency, and wherein the first channel circuitry comprises a first single bin discrete Fourier transform (DFT) block corresponding to the first channel for generating a first set of coefficients of the first channel signal and the second channel circuitry comprises a second single bin discrete Fourier transform (DFT) block corresponding to the second channel for generating a second set of coefficients of the second channel signal.

4. The ATE of claim 3, wherein the first and second single bin discrete Fourier transform (DFT) blocks each comprises a first accumulator and a second accumulator, each for accumulating a corresponding set of coefficients while samples from the first channel and the second channel are being captured.

5. The ATE of claim 4, wherein the first accumulator is configured to accumulate a real part of the coefficients and the second accumulator is configured to accumulate an imaginary part of the coefficients.

6. The ATE of claim 3, wherein the at least one frequency comprises a fundamental frequency.

7. The ATE of claim 3, wherein the at least one frequency comprises harmonic of a fundamental frequency.

8. The ATE of claim 4, wherein coefficients from the first and second single bin discrete DFT blocks are combined to determine the first power.

9. The ATE of claim 1, wherein the first power is estimated within a fixed number of time instants.

10. The ATE of claim 1, wherein the calculated noise floor is lower than the first noise floor and the second noise floor.

11. The ATE of claim 1, wherein the first noise floor and the second noise floor are higher than a noise floor of the DUT.

12. The ATE of claim 1, wherein the processing logic is configured to calculate a signal-to-noise ratio for the DUT.

13. The ATE of claim 1, wherein the processing logic comprises a field programmable gate array (FPGA).

14. The ATE of claim 1, wherein the second total power is an aggregate power of the cross-correlation of the first channel signal and the second channel signal.

15. A method performed by automatic test equipment (ATE), the method comprising:
splitting a deterministic stimulus signal from a device under test (DUT) into a first signal and a second signal, the first signal and the second signal being identical signals;
receiving the first signal in a first channel of the ATE, the first channel adding a first noise floor to the first signal to produce a first channel signal;
receiving the second signal in a second channel of the ATE, the second channel adding a second noise floor to the second signal to produce a second channel signal; and
using processing logic to:
estimate a first power of the deterministic stimulus signal based on a number of samples of the first and second signals, the number of the samples being selected to meet a noise uncertainty criterion that is based on relative noise magnitudes between the DUT and a channel of the deterministic signal, the processing logic comprising first channel circuitry in the first channel and second channel circuitry in the second channel, wherein outputs of the first channel circuitry and the second channel circuitry are used in estimating the first power of the deterministic signal; and
estimate a second total power from the DUT based on the first channel signal and the second channel signal, wherein the processing logic comprises common channel circuitry that estimates, in real-time, the second total power corresponding to an output of cross-correlation of the first channel signal with the second channel signal, the second total power from the DUT comprising the first power plus a noise power from the DUT; and
calculate a noise floor from the first power and the second total power resulting in a calculated noise floor.

16. The method of claim 15, wherein the common channel circuitry comprises a single accumulator that accumulates a value from the cross-correlation while samples from the first channel and the second channel are being captured.

17. The method of claim 15, wherein the deterministic stimulus signal comprises at least one frequency, and wherein the first channel circuitry comprises a first single bin discrete Fourier transform (DFT) block corresponding to the first channel that generates a first set of coefficients of the first channel signal and the second channel circuitry comprises a second single bin discrete Fourier transform (DFT) block corresponding to the second channel that generates a second set of coefficients of the second channel signal.

18. The method of claim 17, wherein the first and second single bin discrete Fourier transform (DFT) blocks each comprises a first accumulator and a second accumulator, each accumulating a corresponding set of coefficients while samples from the first channel and the second channel are being captured.

19. The method of claim 18, wherein the first accumulator accumulates a real part of the coefficients and the second accumulator accumulates an imaginary part of the coefficients.

20. The method of claim 17, wherein the at least one frequency comprises a fundamental frequency.

21. The method of claim 17, wherein the at least one frequency comprises harmonic of a fundamental frequency.

22. The method of claim 18, wherein coefficients from the first and second single bin discrete DFT blocks are combined to determine the first power.

23. The method of claim 15, wherein the first power is estimated within a fixed number of time instants.

24. The method of claim 15, wherein the calculated noise floor is lower than the first noise floor and the second noise floor.

25. The method of claim 15, wherein the first noise floor and the second noise floor are higher than a noise floor of the DUT.

26. The method of claim 15, wherein the processing logic is configured to calculate a signal-to-noise ratio for the DUT.

27. The method of claim 15, wherein the processing logic comprises a field programmable gate array (FPGA).

28. Automatic test equipment (ATE) comprising:
an ATE source channel to provide a stimulus signal;
a circuit to split the stimulus signal into a first signal and a second signal, the first signal and the second signal being identical signals;
a first DUT channel to receive the first signal, the first DUT channel having a first noise floor which produces a first channel signal;
a second DUT channel to receive the second signal, the second DUT channel having a second noise floor which produces a second channel signal; and
processing logic to:
estimate a first power of the first DUT channel based on a number of samples of the first and second signals, the number of the samples being selected to meet a noise uncertainty criterion that is based on relative noise magnitudes between the DUT and a channel of the deterministic signal, the processing logic comprising first channel circuitry in the first DUT channel and second channel circuitry in the second DUT channel, wherein outputs of the first channel circuitry and the second channel circuitry are used in estimating the first power of the deterministic signal;
estimate a second power of the second DUT channel;
estimate a correlated power between the first DUT channel and the second DUT channel by performing cross-correlation of the first channel signal with the second channel signal, the correlated power corresponding to an output of cross-correlation of the first channel signal with the second channel signal; and
estimate the first DUT channel noise power and the second DUT channel noise power based on the first power, the second power, and the correlated power;
wherein the processing logic comprises correlation circuitry for estimating the correlated power, and the correlation circuitry is configured to accumulate a value from the cross-correlation between the first channel signal and the second channel signal while samples from the first channel and the second channel are being captured.

29. The ATE of claim 28, wherein the processing logic comprises auto-correlation circuitry for estimating the first power based on auto-correlation of the first channel signal.

30. The ATE of claim 29, wherein the correlation circuitry comprises a single accumulator for accumulating a value from the auto-correlation while samples from the first channel are being captured.

31. The ATE of claim 28, wherein the correlation circuitry comprises a single accumulator for accumulating a value from the cross-correlation between the first channel signal and the second channel signal while samples from the first channel and the second channel are being captured, the correlated power comprising stimulus signal power and stimulus noise power.

32. The ATE of claim 28, wherein the stimulus signal comprises at least one frequency, and the first channel circuitry comprises a first single bin discrete Fourier transform (DFT) block corresponding to the first channel for generating a first set of coefficients of the first channel signal and the second channel circuitry comprises a second single bin discrete Fourier transform (DFT) block corresponding to the second channel for generating a second set of coefficients of the second channel signal.

33. The ATE of claim 32, wherein the processing logic is for estimating first stimulus signal power based on cross-correlation of the first set of coefficients and second set of coefficients; and for estimating second stimulus signal power based on auto-correlation of the first set of coefficients.

34. The ATE of claim 28, wherein the processing logic is configured to perform operations comprising:
estimating the first power using auto-correlations of the first DUT channel signal;
estimating the second power using auto-correlations of the second DUT channel signal;
estimating the first DUT channel noise power by subtracting the correlated power from the first power; and
estimating the second DUT channel noise power by subtracting the correlated power from the second power.

35. A method performed by automatic test equipment (ATE), the method comprising:
splitting a stimulus signal from an ATE source channel into a first signal and a second signal, the first signal and the second signal being identical signals;
receiving the first signal in a first DUT channel having a first noise floor to produce a first channel signal;
receiving the second signal in a second DUT channel having a second noise floor to produce a second channel signal; and
using processing logic to:
estimate a first power of the first DUT channel based on a number of samples of the first and second signals, the number of the samples being selected to meet a noise uncertainty criterion that is based on relative noise magnitudes between the DUT and a channel of the deterministic signal, the processing logic comprising first channel circuitry in the first DUT channel and second channel circuitry in the second DUT channel, wherein outputs of the first channel circuitry and the second channel circuitry are used in estimating the first power of the deterministic signal;
estimate a second power of the second DUT channel;
estimate the correlated power between the first DUT channel and the second DUT channel by performing cross-correlation of the first channel signal with the second channel signal, the correlated power corresponding to an output of cross-correlation of the first channel signal with the second channel signal; and
estimate the first DUT channel noise power and the second DUT channel noise power based on the first power, the second power, and the correlated power;
wherein correlation circuitry in the processing logic estimates the correlated power and accumulates a value from the cross-correlation between the first channel signal and the second channel signal while samples from the first channel and the second channel are being captured.

36. The method of claim 35, wherein auto-correlation circuitry that is part of the processing logic estimates the first power based on auto-correlation of the first channel signal.

37. The method of claim 35, wherein the processing logic performs operations comprising:
estimating the first power using auto-correlations of the first DUT channel signal;
estimating the second power using auto-correlations of the second DUT channel signal;
estimating the first DUT channel noise power by subtracting the correlated power from the first power; and
estimating the second DUT channel noise power by subtracting the correlated power from the second power.

38. Automatic test equipment (ATE) comprising:
an ATE source channel to provide a stimulus signal;
a first circuit to split the stimulus signal into a first signal and a second signal, the first signal and the second signal being identical signals;
a first DUT channel to receive the first signal, the first DUT channel having a first noise floor which produces a first channel signal;
a second DUT channel to receive the second signal, the second DUT channel having a second noise floor which produces a second channel signal;
a second circuit to split the first channel signal into a third signal and a fourth signal;
a third channel to receive the third signal, the third channel adding a third noise floor to the third signal to produce a third channel signal;
a fourth channel to receive the fourth signal, the fourth channel adding a fourth noise floor to the fourth signal to produce a fourth channel signal;
a third circuit to split the second channel signal into a fifth signal and a sixth signal;
a fifth channel to receive the fifth signal, the fifth channel adding a fifth noise floor to the fifth signal to produce a fifth channel signal;
a sixth channel to receive the sixth signal, the sixth channel adding a sixth noise floor to the sixth signal to produce a sixth channel signal; and
processing logic to:
estimate a first power of the first channel signal;
estimate a first total power based on the third channel signal and the fourth channel signal;
estimate a second power of the second channel signal;
estimate a second total power based on the fifth channel signal and the sixth channel signal;
estimate a third power of the first DUT channel;
estimate a fourth power of the second DUT channel;
estimate correlated power between the first DUT channel and the second DUT channel using cross-correlation of the first channel signal and the second channel signal; and
estimate the first DUT channel noise power and the second DUT channel noise power based on the third power, the fourth power, and the correlated power.

* * * * *